(12) United States Patent
Guo et al.

(10) Patent No.: US 12,267,044 B2
(45) Date of Patent: Apr. 1, 2025

(54) FREQUENCY GENERATOR

(71) Applicants: Beijing BOE Technology Development Co., Ltd., Beijing (CN); BOE TECHNOLOGY GROUP CO., LTD., Beijing (CN)

(72) Inventors: Junwei Guo, Beijing (CN); Feng Qu, Beijing (CN); Biqi Li, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/029,173

(22) PCT Filed: Mar. 23, 2022

(86) PCT No.: PCT/CN2022/082498
§ 371 (c)(1),
(2) Date: Mar. 29, 2023

(87) PCT Pub. No.: WO2023/178552
PCT Pub. Date: Sep. 28, 2023

(65) Prior Publication Data
US 2024/0364265 A1   Oct. 31, 2024

(51) Int. Cl.
*H03D 7/14* (2006.01)
*H03K 5/1252* (2006.01)
*H03K 21/00* (2006.01)

(52) U.S. Cl.
CPC ......... *H03D 7/1458* (2013.01); *H03K 5/1252* (2013.01); *H03K 21/00* (2013.01)

(58) Field of Classification Search
CPC ...... H03K 5/125; H03K 5/1252; H03K 21/00; H03K 21/02; H03K 21/08; H03K 21/16;
(Continued)

(56) References Cited

U.S. PATENT DOCUMENTS

| | | | |
|---|---|---|---|
| 5,343,168 A | 8/1994 | Guthrie et al. | |
| 8,044,725 B2 * | 10/2011 | Richt | H03L 7/18 708/271 |

FOREIGN PATENT DOCUMENTS

| | | |
|---|---|---|
| CN | 105141310 A | 12/2015 |
| CN | 205647494 U | 10/2016 |

(Continued)

*Primary Examiner* — Long Nguyen
(74) *Attorney, Agent, or Firm* — HOUTTEMAN LAW LLC (57) ABSTRACT

The present disclosure provides a frequency generator, and belongs to the technical field of communications. The frequency generator provided by the present disclosure includes: N stages of mixing modules and N stages of comb spectrum generation modules. Each of the comb spectrum generation modules is configured to provide a mixing module in a same stage as the comb spectrum generation modules with one stage of fundamental signal group generated according to a second reference signal; and different stages of fundamental signal groups are generated based on different second reference signals. A $1^{st}$-stage mixing module generates a $1^{st}$-stage mixed signal according to a $1^{st}$-stage fundamental signal group and a first reference signal, and the $1^{st}$-stage fundamental signal group includes a plurality of harmonic signals with a first frequency as a fundamental frequency.

14 Claims, 3 Drawing Sheets

(58) Field of Classification Search
CPC ...... H03D 7/14; H03D 7/1408; H03D 7/1425; H03D 7/1458; H03D 7/1466; H03D 7/1475; H03D 7/1483; H03D 7/16; H03D 7/161; H03D 2200/0066
See application file for complete search history.

(56) References Cited

FOREIGN PATENT DOCUMENTS

| | | | |
|---|---|---|---|
| CN | 110208747 | A | 9/2019 |
| CN | 110289858 | A | 9/2019 |
| CN | 210839562 | U | 6/2020 |
| CN | 113452410 | A | 9/2021 |
| CN | 113452410 | B | 6/2022 |

\* cited by examiner

FREQUENCY GENERATOR

TECHNICAL FIELD

The present disclosure belongs to the technical field of communications, and particularly relates to a frequency generator.

BACKGROUND

A frequency generator is configured to provide accurate and stable clock signals in a wireless communication system. In order to obtain high-precision clock signals, a quartz crystal oscillator is generally adopted. However, a frequency of the quartz crystal oscillator cannot be easily changed, so that the quartz crystal oscillator cannot be applied to a communication system with multiple channel frequencies. Multi-frequency and highly stable outputs of the clock signals can be obtained through frequency synthesis technologies such as a Phase Locked Loop (PLL), frequency multiplication, and frequency division.

As a frequency range and a bandwidth covered by a radio frequency system in the wireless communication system become wider and wider, a higher requirement is proposed on the frequency coverage of the frequency generator. In the prior art, the frequency generator has limited frequency coverage, and multiple times of frequency conversion are in general needed for the frequency coverage of the frequency generator to cover a target frequency, which increases a design cost of a system, and reduces reliability of the system.

SUMMARY

In order to solve at least one of the technical problems in the prior art, the present disclosure provides a frequency generator.

In a first aspect, the present disclosure provides a frequency generator, including: N stages of mixing modules and N stages of comb spectrum generation modules; wherein, N≥2; each of the comb spectrum generation modules is configured to provide a mixing module in a same stage as the comb spectrum generation modules with one stage of fundamental signal group generated according to a second reference signal; and different stages of fundamental signal groups are generated based on different second reference signals; a $1^{st}$-stage mixing module generates a $1^{st}$-stage mixed signal according to a $1^{st}$-stage fundamental signal group and a first reference signal; and the $1^{st}$-stage fundamental signal group includes a plurality of harmonic signals with a first frequency as a fundamental frequency; and an $i^{th}$-stage mixing module generates an $i^{th}$-stage mixed signal according to an $i^{th}$-stage fundamental signal group and a $(i-1)^{th}$-stage mixed signal; the $i^{th}$-stage fundamental signal group includes a plurality of harmonic signals with an $i^{th}$ frequency as a fundamental frequency; and 2≤i≤N.

Each of at least some of the comb spectrum generation modules includes: a step diode; and the step diode is configured to generate a plurality of harmonic signals with a frequency of the second reference signal as a fundamental frequency according to the second reference signal.

Each of the at least some of the comb spectrum generation modules further includes: a band-pass filter bank configured to filter the plurality of harmonic signals with the frequency of the second reference signal as the fundamental frequency to generate the fundamental signal group.

Each of at least some of the comb spectrum generation modules includes: a first Direct Digital Synthesis (DDS) signal generator and a frequency divider group. The first DDS signal generator is configured to generate the second reference signal according to a signal to be output by the frequency generator; and the frequency divider group is configured to generate a plurality of first frequency-divided signals according to the second reference signal: and the first frequency-divided signals include the plurality of harmonic signals with the $i^{th}$ frequency as the fundamental frequency.

Each of the at least some of the comb spectrum generation modules further includes a switching filter bank; and the switching filter bank generates the plurality of harmonic signals with the $i^{th}$ frequency as the fundamental frequency according to the plurality of first frequency-divided signals and the second reference signal.

Each of the at least some of the comb spectrum generation modules further includes a first mixer; and the first mixer is configured to generate the fundamental signal group according to a third reference signal and the plurality of harmonic signals with the $i^{th}$ frequency as the fundamental frequency.

The frequency divider group includes a first frequency divider, a second frequency divider, and a third frequency divider; and the first frequency-divided signals include a first frequency-divided sub-signal, a second frequency-divided sub-signal, and a third frequency-divided sub-signal. The first frequency divider is configured to generate the first frequency-divided sub-signal according to the second reference signal such that a frequency of the first frequency-divided sub-signal is a half of a frequency of the second reference signal; the second frequency divider is configured to generate the second frequency-divided sub-signal according to the second reference signal such that a frequency of the second frequency-divided sub-signal is one fourth of the frequency of the second reference signal; and the third frequency divider is configured to generate the third frequency-divided sub-signal according to the second reference signal such that a frequency of the third frequency-divided sub-signal is one sixth of the frequency of the second reference signal.

The mixing module includes a double balanced mixers having a first signal input terminal, a second signal input terminal, and a first signal output terminal. The first signal input terminal is configured to receive the harmonic signals in the fundamental signal group; the second signal input terminal is configured to receive the first reference signal or the $(i-1)^{th}$-stage mixed signal; and the first signal output terminal is configured to generate the mixed signal according to the signal received by the first signal input terminal and the signal received by the second signal input terminal.

The first frequency is equal to or less than twice a frequency of the first reference signal.

An $N^{th}$-stage mixing module includes a fourth frequency divider and a first frequency multiplier. The fourth frequency divider is configured to generate a first mixed sub-signal according to the mixed signal output from the first signal output terminal of the double balanced mixer in the $N^{th}$-stage mixing module; the first frequency multiplier is configured to generate a second mixed sub-signal according to the mixed signal output from the first signal output terminal of the double balanced mixer in the $N^{th}$-stage mixing module; and an $N^{th}$-stage mixed signal generated by the $N^{th}$-stage mixing module includes the first mixed sub-signal, the second mixed sub-signal, and the mixed signal output from the first signal output terminal of the double balanced mixer in the $N^{th}$-stage mixing module.

The frequency generator further includes: a first signal generation module; and the first signal generation module is configured to generate the first reference signal according to a signal to be output by the frequency generator.

The first signal generation module includes a phase locked loop; and the phase-locked loop is configured to generate the first reference signal according to the signal to be output by the frequency generator.

The first signal generation module includes a second DDS signal generator; and the second DDS signal generator is configured to generate the first reference signal according to the signal to be output by the frequency generator.

N is 2, and i is 2.

DETAIL DESCRIPTION OF EMBODIMENTS

In order to enable those of ordinary skill in the art to better understand the technical solutions of the present disclosure, the present disclosure is further described in detail below with reference to the drawings and specific embodiments.

Unless otherwise defined, technical terms or scientific terms used herein should have general meanings that are understood by those of ordinary skill in the technical field to which the present disclosure belongs. The words "first", "second" and the like used herein do not denote any order, quantity or importance, but are just used to distinguish between different elements. Similarly, the words "one", "a", "the" and the like do not denote a limitation to quantity, and indicate the existence of "at least one" instead. The words "include", "comprise" and the like indicate that an element or object before the words covers the elements or objects listed after the words or the equivalents thereof, rather than excluding other elements or objects. The words "connect", "couple" and the like are not restricted to physical or mechanical connection, but may also indicate electrical connection, whether direct or indirect. The words "on", "under", "left", "right" and the like are only used to indicate relative positional relationships. When an absolute position of an object described is changed, the relative positional relationships may also be changed accordingly.

Figure 1:
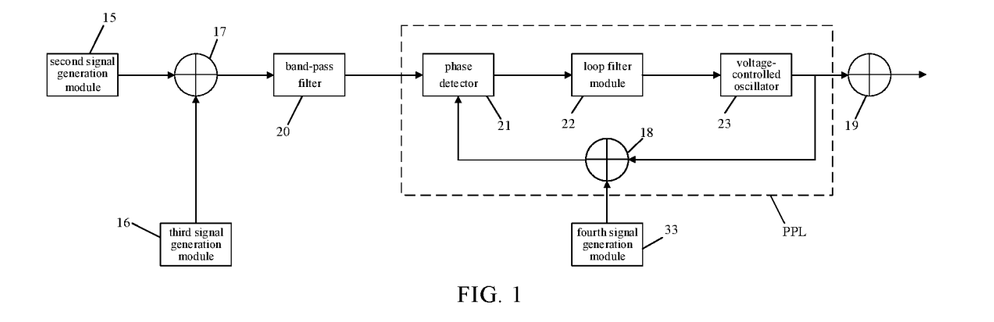
FIG. 1 is a schematic diagram showing an exemplary frequency generator.

In a first aspect, FIG. 1 is a schematic diagram showing an exemplary frequency generator. As shown in FIG. 1, a second signal generation module 15 and a phase locked loop (PLL) are direct combined to form a wideband frequency source. With reference to FIG. 1, the exemplary frequency generator includes: the second signal generation module 15, a third signal generation module 16, a second mixer 17, a third mixer 18, a fourth mixer 19, a band-pass filter 20, a phase detector 21, a loop filter module 22, and a voltage-controlled oscillator 23. The second signal generation module 15 is configured to generate a reference signal group including a plurality of reference signals having different frequencies. The reference signal group is configured to be transmitted to the second mixer 17 according to a frequency of a first output signal to be output by the exemplary frequency generator. The third signal generation module is configured to generate a coarse adjustment signal according to the frequency of the first output signal to be output by the exemplary frequency generator, and transmit the coarse adjustment signal to the second mixer 17. The second mixer 17 mixes the reference signals in the reference signal group with the coarse adjustment signal to generate a first to-be-detected signal, and transmits the first to-be-detected signal to the band-pass filter 20. In this way, the signals generated by the second signal generation module 15 are coarsely adjusted to reduce frequency conversion locking time of the frequency generator. The band-pass filter 20 filters the first to-be-detected signal to generate a second to-be-detected signal.

In the exemplary frequency generator, the phase detector 21, the loop filter module 22, the voltage-controlled oscillator 23, the third mixer 18, and the third signal generation module 16 form the PLL. The phase detector 21 is configured to generate a first error signal according to a to-be-detected signal and a feedback signal input into the phase detector 20. In some exemplary embodiments, when the to-be-detected signal and the feedback signal have a phase difference therebetween, the first error signal generated by the phase detector 21 includes a low frequency signal variation component; and when the to-be-detected signal and the feedback signal have no phase difference therebetween, the first error signal generated by the phase detector 21 includes a high frequency component and a direct current signal. The loop filter module 22 is configured to filter the first error signal generated by the phase detector 21 to generate a second error signal. When the to-be-detected signal and the feedback signal have the phase difference therebetween, the second error signal generated by the loop filter module 22 includes a low frequency signal variation component, which can control a frequency of a signal output by the voltage-controlled oscillator 23 to change; and when the to-be-detected signal and the feedback signal have no phase difference therebetween, the second error signal generated by the loop filter module 22 is a direct current signal. In this way, high-frequency signals and noise in the error signals can be filtered out, and functions and performance of the PLL can be guaranteed. The voltage-controlled oscillator 23 is configured to generate a third to-be-detected signal according to the second error signal. When the second error signal includes the low frequency signal variation component, a frequency of the third to-be-detected signal is changed, and an absolute value of a difference between the frequency of the third to-be-detected signal and a frequency of the to-be-detected signal input into the phase detector 21 is changed. When the second error signal is a direct current signal, the frequency of the third to-be-detected signal is not changed. By continuously changing the frequency of the third to-be-detected signal output by the voltage-controlled oscillator 23, the voltage-controlled oscillator 23 finally locks an output frequency of the PLL. A fourth signal generation module 33 is configured to generate a fine adjustment signal according to the frequency of the first output signal to be output by the exemplary frequency generator. The third mixer 18 mixes the fine adjustment signal with the third to-be-detected signal to generate a first feedback signal. In this way, a feedback loop of the output of the voltage-controlled oscillator 23 can be realized, and meanwhile both of the fourth signal generation module 33 and the third mixer 18 finely adjust the third to-be-detected signal fed back by the voltage-controlled oscillator 23, so that the frequency conversion locking time of the frequency generator can be reduced.

An operation process for the exemplary PLL is as follows: the to-be-detected signal input into the phase detector 21 is the second to-be-detected signal, and the feedback signal input into the phase detector 21 is the first feedback signal. The phase detector 21 generates the first error signal according to the phase difference between the second to-be-detected signal and the first feedback signal, and transmits the first error signal to the loop filter module 22, and at this time, the first error signal includes the low frequency signal variation component. The loop filter module 22 filters the received first error signal to filter out a high frequency signal and a noise signal in the first error signal, and generates the second error signal. At this time, since the first error signal includes the low frequency signal variation component, the second error signal output by the loop filter module 22 also includes the low frequency signal variation component. Meanwhile, the second error signal is transmitted to the voltage-controlled oscillator 23, and the voltage-controlled oscillator 23 receives the second error signal. The frequency of the third to-be-detected signal output by the voltage-controlled oscillator 23 is changed, since the second error signal includes the low frequency signal variation component. The third to-be-detected signal is transmitted to the third mixer 18. The third mixer 18 mixes the fine adjustment signal generated by the fourth signal generation module 33 with the third to-be-detected signal to generate a mixed first feedback signal. Since the frequency of the third to-be-detected signal is changed and the third to-be-detected signal is mixed with the fine adjustment signal by the third mixer 18, a frequency of the first feedback signal is also changed, and an absolute value of a difference between the frequency of the first feedback signal and a frequency of the second to-be-detected signal is decreased.

After the frequency of the first feedback signal is circulated for a plurality of times, the frequency of the first feedback signal is substantially consistent with the frequency of the second to-be-detected signal. At this time, the first error signal output by the phase detector 21 only includes the direct current signal and the high frequency component. The loop filter module 22 filters the first error signal to filter out the high frequency component and the noise signal in the first error signal, and generates the second error signal. At this time, since the second error signal only includes a direct current component, the frequency of the third to-be-detected signal output by the voltage-controlled oscillator 23 is not changed. The third to-be-detected signal is transmitted to the third mixer 18. The third mixer 18 mixes the fine adjustment signal generated by the fourth signal generation module 33 with the third to-be-detected signal to generate the mixed first feedback signal. Since the frequency of the third to-be-detected signal is not changed, the difference between the frequency of the first feedback signal and the frequency of the second to-be-detected signal is not changed. Thus, the PLL completes locking of a signal frequency.

In the exemplary frequency generator, in order to further reduce the frequency conversion locking time of the frequency generator, the frequency generator further includes a fourth mixer 19, which mixes the third to-be-detected signal output by the PLL with the fine adjustment signal generated by the fourth signal generation module 33 to generate the first output signal as an output signal of the exemplary frequency generator.

In the exemplary frequency generator, the second signal generation module 15 generates the reference signal group including the plurality of reference signals having the different frequencies. The PLL and the fourth mixer 19 process the reference signals to generate the first output signal as the output signal of the exemplary frequency generator. The output signal of the exemplary frequency generator can be changed by switching between the different reference signals. In this way, the exemplary frequency generator can serve as a wideband frequency source.

However, a frequency range of the first output signal of the exemplary frequency generator is limited by the performance of the PLL, so that the exemplary frequency generator cannot serve as an ultra-wideband frequency source.

In view of the above problem, an embodiment of the present disclosure provides a new frequency generator.

Figure 2:
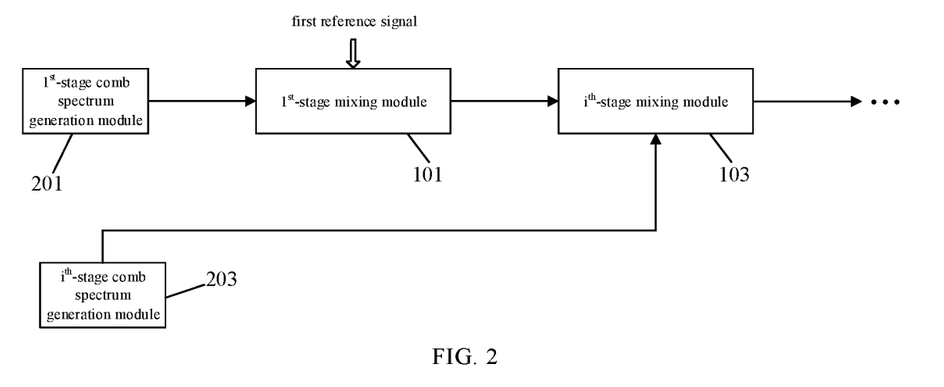
FIG. 2 is a schematic diagram showing a frequency generator according to an embodiment of the present disclosure.

In a first aspect, as shown in FIG. 2, the present disclosure provides a frequency generator, including: N stages of mixing modules 101, 103 and N stages of comb spectrum generation modules 201, 203, with N≥2. Each of the comb spectrum generation modules is configured to provide one stage of fundamental signal group generated according to a second reference signal for the mixing module in the same stage as the comb spectrum generation module, and the different stages of fundamental signal groups are generated based on different second reference signals. A $1^{st}$-stage mixing module 101 generates a $1^{st}$-stage mixed signal according to a $1^{st}$-stage fundamental signal group and a first reference signal, and the $1^{st}$-stage fundamental signal group includes a plurality of harmonic signals with a first frequency as a fundamental frequency. An $i^{th}$-stage mixing module 103 generates an $i^{th}$-stage mixed signal according to an $i^{th}$-stage fundamental signal group and a $(i-1)^{th}$-stage mixed signal, and the $i^{th}$-stage fundamental signal group includes a plurality of harmonic signals with an $i^{th}$ frequency as a fundamental frequency; and $2 \le i \le N$.

Figure 3:
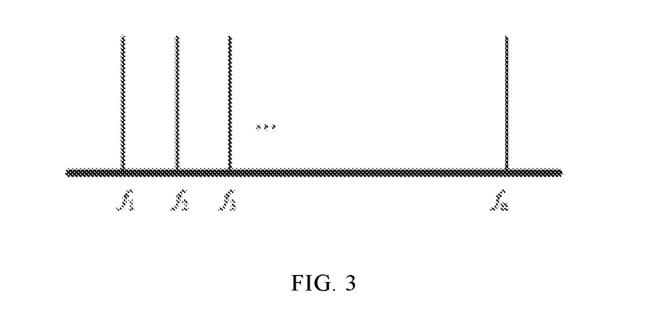
FIG. 3 is a schematic diagram showing an output frequency of a comb spectrum generation module according to an embodiment of the present disclosure.

In the embodiments of the present disclosure, the comb spectrum generation modules are configured to provide the mixed signals needed by the stages of mixing modules for the mixing modules. Specifically, as shown in FIG. 3, the comb spectrum generation module may multiply an input single-frequency signal to generate a group of harmonic signals with a frequency of the input single-frequency signal as a reference frequency. In the embodiments of the present disclosure, the single-frequency signal input into the comb spectrum generation module is the second reference signal, so that the comb spectrum generation module generates the fundamental signal group with a frequency of the second reference signal as a reference frequency. Since the frequency generator provided by the embodiments of the present disclosure includes multiple stages of mixing modules and multiple stages of comb spectrum generation modules and frequencies of the fundamental signal groups needed by the various stages of the mixing modules are different, the different stages of the fundamental signal groups are generated based on the different the second reference signals. In this way, the comb spectrum generation modules may provide the fundamental signal groups with different second reference frequencies as the reference frequencies for the different stages of the mixing modules, respectively.

In the embodiments of the present disclosure, still with reference to FIG. 2, since the $1^{st}$-stage mixing module 101 mixes the $1^{st}$-stage harmonic signal in the $1^{st}$-stage fundamental signal group with the first reference signal, a frequency range of the generated $1^{st}$-stage mixed signal is expanded. Since the $i^{th}$-stage ($2 \leq i \leq N$) mixing module 101 mixes the $i^{th}$-stage harmonic signal in the $i^{th}$-stage fundamental signal group generated by the $i^{th}$-stage comb spectrum generation module 103 with the $(i-1)^{th}$-stage mixed signal, a frequency range of the generated $i^{th}$-stage mixed signal is expanded, and so on, until an $N^{th}$-stage mixing module mixes $N^{th}$-stage harmonic signal in an $N^{th}$-stage fundamental signal group with a $(N-1)^{th}$-stage mixed signal to finally generate an $N^{th}$-stage mixed signal as an output signal of the frequency generator provided by the embodiments of the present disclosure. In the embodiments of the present disclosure, the multiple stages of the mixing modules are provided, each of which mixes the fundamental signal group generated by one comb spectrum generation module with the mixed signal output by the mixing module in a immediately previous stage, thereby finally obtaining $N^{th}$-stage mixed signal with a ultra-wideband as the output signal of the frequency generator. In this way, the frequency generator can be used as an ultra-wideband frequency source. In addition, since phase lock carried out by a PLL is not needed in a frequency conversion process, the frequency switching time (i.e., time of frequency modulation or time of frequency agility) of the frequency generator can be reduced.

Figure 4:
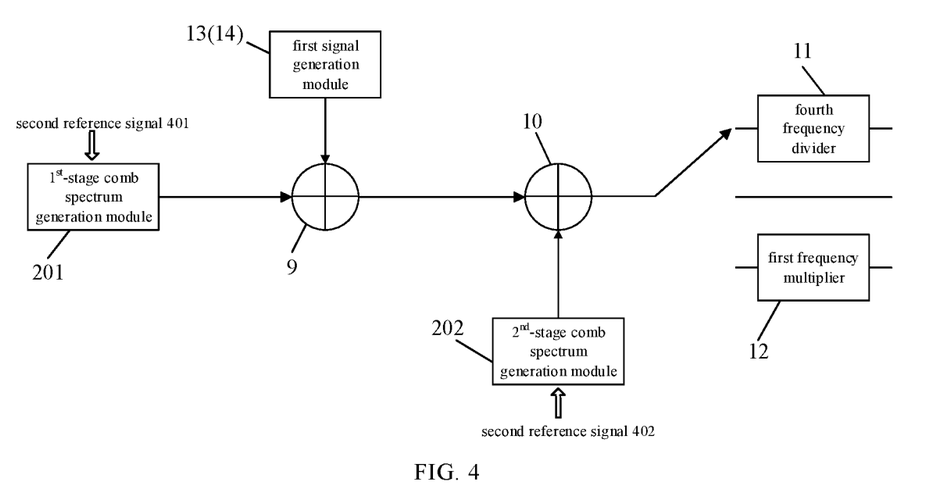
FIG. 4 is a schematic diagram showing a frequency generator according to another embodiment of the present disclosure.

In some embodiments, FIG. 4 is a schematic diagram showing a frequency generator according to an embodiment of the present disclosure. As show in FIG. 4, in the frequency generator shown in FIG. 4, N is 2 and i is 2. That is, the frequency generator shown in FIG. 4 includes only two stages of the mixing modules, and the embodiments below are described only by taking N being 2 and i being 2 as an example. In the embodiments of the present disclosure, the frequency generator includes two stages of mixing modules and two stages of comb spectrum generation modules 2. A $1^{st}$-stage comb spectrum generation module 201 is configured to provide a $1^{st}$-stage fundamental signal group generated according to a second reference signal 401 for a $1^{st}$-stage mixing module 101. The $1^{st}$-stage mixing module 101 generates a $1^{st}$-stage mixed signal according to the $1^{st}$-stage fundamental signal group and a first reference signal, and the $1^{st}$-stage fundamental signal group includes a plurality of harmonic signals with a first frequency as a fundamental frequency. A $2^{nd}$-stage comb spectrum generation module 202 is configured to provide a $2^{nd}$-stage fundamental signal group generated according to a second reference signal 402 for a $2^{nd}$-stage mixing module 102. The $2^{nd}$-stage mixing module 102 generates a $2^{nd}$-stage mixed signal according to the $2^{nd}$-stage fundamental signal group and the $1^{st}$-stage mixed signal, the $2^{nd}$-stage fundamental signal group includes a plurality of harmonic signals with a second frequency as a fundamental frequency, and the $2^{nd}$-stage mixing module 102 serves as an output module of the frequency generator. In this way, the frequency generator provided by the embodiments of the present disclosure has a simple circuit structure, and is easy to manufacture.

In some embodiments, still with reference to FIG. 4, the mixing modules include double balanced mixers. Each of the double balanced mixers includes a first signal input terminal, a second signal input terminal, and a first signal output terminal. The first signal input terminal is configured to receive the harmonic signals of the fundamental signal group. The second signal input terminal is configured to receive the first reference signal or the $1^{st}$-stage mixed signal. The first signal output terminal is configured to generate the mixed signal according to the signal received by the first signal input terminal and the signal received by the second signal input terminal.

In the embodiments of the present disclosure, since the frequency generator includes only two stages of the mixing modules, the $1^{st}$-stage mixing module 101 includes a first double balanced mixer 9. A first signal input terminal of the first double balanced mixer 9 receives the harmonic signals of the $1^{st}$-stage fundamental signal group which have the first frequency as the fundamental frequency, and a second signal input terminal of the first double balanced mixer 9 receives the first reference signal. Since an output of the double balanced mixer is a sum of frequencies of the signals received by the two input terminals or a difference between the frequencies of the signals received by the two input terminals, a frequency of the $1^{st}$-stage mixed signal output from the first signal output terminal of the first double balanced mixer 9 is equal to a sum of the frequency of the harmonic signal of the $1^{st}$-stage fundamental signal group with the first frequency as the fundamental frequency and the frequency of the first reference signal or equal to a difference between the frequency of the harmonic signal of the $1^{st}$-stage fundamental signal group with the first frequency as the fundamental frequency and the frequency of the first reference signal. For example, the number of stages of the harmonic signals in the $1^{st}$-stage fundamental signal group is 3, and the frequencies of the harmonic signals in the $1^{st}$-stage fundamental signal group may be 1.2 GHz, 1.8 GHz, and 2.4 GHz respectively, and the frequency of the first reference signal may be 0.3 GHz. In such case, a frequency range of the $1^{st}$-stage mixed signal output from the first signal output terminal of the first double balanced mixer 9 ranges from 0.9 GHz to 2.7 GHz. In some embodiments, in order to ensure frequency continuity of the $1^{st}$-stage mixed signal, the first frequency is equal to or less than twice the frequency of the first reference signal.

In the embodiments of the present disclosure, the $2^{nd}$-stage mixing module 102 includes a second double balanced mixer 10. A second signal input terminal of the second double balanced mixer 10 receives the harmonic signals of the $2^{nd}$-stage fundamental signal group which have the second frequency as the fundamental frequency, and a second signal input terminal of the second double balanced mixer 10 receives the $1^{st}$-stage mixed signal. Since an output of the double balanced mixer is a sum of frequencies of the signals received by the two input terminals or a difference between the frequencies of the signals received by the two input terminals, a frequency of a $2^{nd}$-stage mixed signal output from the first signal output terminal of the second double balanced mixer 10 is equal to a sum of the frequency of the harmonic signal of the $2^{nd}$-stage fundamental signal group with the second frequency as the fundamental frequency and the frequency of the $1^{st}$-stage mixed signal or a difference between the frequency of the harmonic signal of the $2^{nd}$-stage fundamental signal group with the second frequency as the fundamental frequency and the frequency of the $1^{st}$-stage mixed signal. For example, the number of stages of the harmonic signals in the $2^{nd}$-stage fundamental signal group is 4, and the frequencies of the harmonic signals in the $2^{nd}$-stage fundamental signal group may be 12 GHz, 14 GHz, 16 GHz, and 18 GHz respectively. In such case, a frequency range of the $2^{nd}$-stage mixed signal output from the first signal output terminal of the second double balanced mixer 10 ranges from 10 GHz to 20 GHz. In this way, a frequency bandwidth of an output of the frequency generator output can be expanded.

In some embodiments, in order to further expand the frequency bandwidth of the output of the frequency generator and enable the frequency bandwidth to cover a commonly used frequency range, the $2^{nd}$-stage mixing module 102 in the frequency generator further includes a fourth frequency divider 11 and a first frequency multiplier 12. The fourth frequency divider 11 is configured to generate a first mixed sub-signal according to the mixed signal output from the first signal output terminal of the second double balanced mixer 10 in the $2^{nd}$-stage mixing module 102. The first frequency multiplier 12 is configured to generate a second mixed sub-signal according to the mixed signal output from the first signal output terminal of the second double balanced mixer 10 in the $2^{nd}$-stage mixing module 102. The $2^{nd}$-stage mixed signal generated by the $2^{nd}$-stage mixing module 102 includes the first mixed sub-signal, the second mixed sub-signal, and a mixed signal output from a first signal output terminal of a double balanced mixer in the $N^{th}$-stage mixing module.

Specifically, with reference to FIG. 4, in the embodiments of the present disclosure, since the frequency range of the $2^{nd}$-stage mixed signal output from the first signal output terminal of the second double balanced mixer 10 ranges from 10 GHz to 20 GHz, the fourth frequency divider 11 performs a frequency division operation on the $2^{nd}$-stage mixed signal output from the first signal output terminal of the second double balanced mixer 10 to generate the first mixed sub-signal with a frequency range from 5 GHz to 10 GHz. The first frequency multiplier 12 performs a frequency multiplication operation on the $2^{nd}$-stage mixed signal output from the first signal output terminal of the second double balanced mixer 10 to generate the second mixed sub-signal with a frequency range from 20 GHz to 40 GHz. The frequency range of the $2^{nd}$-stage mixed signal output from the first signal output terminal of the second double balanced mixer 10 ranges from 10 GHz to 20 GHz. Therefore, at this time, the frequency range of the $2^{nd}$-stage mixed signal generated by the $2^{nd}$-stage mixing module 102 ranges from 5 GHz to 40 GHz. In this way, the frequency bandwidth of the frequency generator can be further expanded to cover the commonly used frequency range.

In some embodiments, the frequency generator may further include a first signal generation module 13, which is configured to generate the first reference signal according to a mixed signal to be generated. In this way, in the embodiments of the present disclosure, the first signal generation module 13 provides the first reference signal for the frequency generator according to the mixed signal to be output by the frequency generator.

In some embodiments, the first signal generation module 13 may include a PLL, which is configured to generate the first reference signal according to the mixed signal to be generated. In the embodiments of the present disclosure, the PLL may adopt the structure of the PLL shown in FIG. 1, and thus will not be repeated here. The PLL provides the first reference signal for the frequency generator according to the mixed signal to be output by the frequency generator. For example, when an output frequency of the frequency generator ranges from 10 GHz to 20 GHz, a frequency of the first reference signal output by the PLL may be 0.3 GHz. In this way, the spurious strength of the frequency generator can be reduced.

In some embodiments, the first signal generation module 13 may include a second DDS signal generator 14, which is configured to generate the first reference signal according to a signal to be output by the frequency generator. In the embodiments of the present disclosure, the second DDS signal generator 14 provides the first reference signal for the frequency generator according to the mixed signal to be output by the frequency generator. For example, a frequency of the first reference signal output by the second DDS signal generator 14 may be $f_0$. At this time, a $1^{st}$-stage comb spectrum generation module generates a first fundamental signal group according to a second reference signal 401 with a frequency $f_1$, and the number of stages of harmonic signals in the first fundamental signal group is $N_1$; at this time, a $2^{nd}$-stage comb spectrum generation module generates a second fundamental signal group according to a second reference signal 402 with a frequency $f_2$, and the number of stages of harmonic signals in the second fundamental signal group is $N_2$; and $f_1$ and $f_2$ may be integral multiples of $f_0$, and $N_1$ and $N_2$ may be integers from 4 to 7. In such case, the frequency of the signal output from the first signal output terminal of the second double balanced mixer 10 ranges from $(f_2-N_1-f_0)$ to $(N_2*f_2+N_1*f_1+f_0)$. At this time, if $f_1=A_1*f_0$ and $f_2=A_2*f_0$, the frequency of the signal output from the first signal output terminal of the second double balanced mixer 10 ranges from $[(A_2-A_1*N_1)*f_0]$ to $[(A_2*N_2+A_1*N_1+1)*f_0]$, so that a frequency value of the first reference signal output by the second DDS signal generator 14 may be set according to the frequency range of the signal output from the first signal output terminal of the second double balanced mixer 10. Meanwhile, in the embodiments of the present disclosure, since a frequency step value of the frequency generator is a minimum step frequency of the second DDS signal generator 14, a step frequency of the frequency generator is small.

Figure 5:
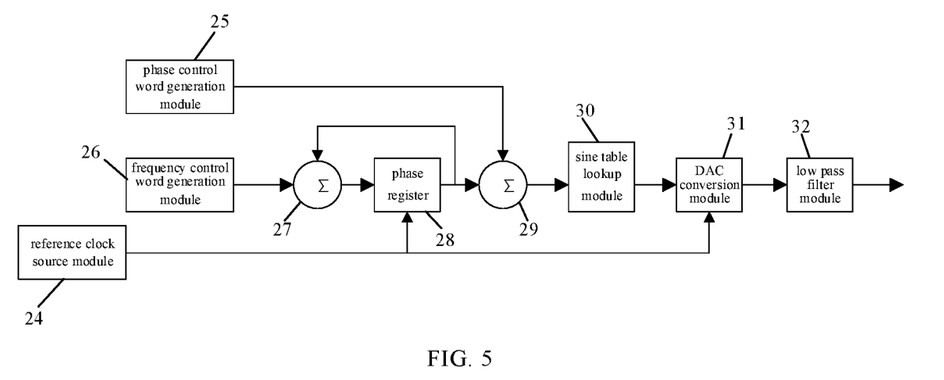
FIG. 5 is a schematic diagram showing a first DDS signal generator and/or a second DDS signal generator according to an embodiment of the present disclosure.

In some embodiments, as shown in FIG. 5, the second DDS signal generator 14 includes a reference clock source module 24, a phase control word generation module 25, a frequency control word generation module 26, a phase accumulator 27, a phase register 28, a phase modulator 29, a sine table lookup module 30, a DAC conversion module 31, and a low-pass filter module 32. The reference clock source module 24 is configured to provide a reference clock signal for the second DDS signal generator 14. The phase control word generation module is configured to generate a phase control word for the second DDS signal generator, and the phase control word controls a phase of a signal generated by the second DDS signal generator 14. The frequency control word generation module 26 is configured to generate a frequency control word for the second DDS signal generator 14, and the frequency control word controls a frequency of the signal generated by the second DDS signal generator 14. The phase accumulator 27 is configured to add the frequency control word to accumulated phase data output by the phase register 28 under the control of the reference clock signal. The phase register 28 is configured to transmit accumulated phase data generated, by the phase accumulator 27, after an immediately previous clock signal is triggered to the phase accumulator 27. The phase modulator 29 is configured to add an output of the phase register 28 and the phase control word to obtain a phase-adjusted to-be-looked-up signal. The sine table lookup module 30 includes digital amplitude information of a complete cycle of a sine wave, and is configured to map the input to-be-looked-up signal into a sine wave amplitude signal. The DAC conversion module 31 is configured to convert the sine wave amplitude signal in a digital form into a desired synthesized frequency signal in an analog form. The low-pass filter module 32 is configured to attenuate and filter out an unwanted sample component, so as to output a sine wave signal with a pure frequency spectrum.

For the second DDS signal generator 14 in the embodiments of the present disclosure, an operation process of the second DDS signal generator 14 is as follows: the phase control word generation module generates the phase control word according to the first reference signal to be output by the second DDS signal generator 14. The frequency control word generation module 26 generates the frequency control word according to the first reference signal to be output by the second DDS signal generator 14. The reference clock source module 24 generates the reference clock signal according to the first reference signal to be output by the second DDS signal generator 14. Each time a clock pulse in the reference clock signal is triggered, the phase accumulator 27 adds the frequency control word to the accumulated phase data output by the phase register 28, and then transmits the added result to a data input terminal of the phase register 28. The phase register 28 feeds back the new accumulated phase data generated, by the phase accumulator 27, after an immediately previous clock is triggered to an input terminal of the phase accumulator 27, so as to allow the phase accumulator 27 to continue to add the new accumulated phase data to the frequency control data under the control of a next clock. The phase accumulator 27 keeps performing the linear phase accumulation operation under the control of the reference clocks. When the accumulation of the phase accumulator 27 is full, an overflow will occur to complete a periodic action. The overflow frequency of the phase accumulator 27 is the frequency of the first reference signal output by the second DDS signal generator 14. The phase modulator 29 adds a signal output by the phase register 28 to the phase control word, and the added result serves as an address of a sine lookup table in the sine table lookup module 30. The sine lookup table is composed of ROM, and maps input address information into the sine wave amplitude signal. Meanwhile, the sine wave amplitude signal is output to an input terminal of the DAC conversion module 31, and the DAC conversion module 31 converts waveform amplitude in a digital form into the desired synthesized frequency signal in the analog form. The low-pass filter module filters out the unwanted sample component to output the sine wave signal with a pure frequency spectrum.

It should be noted that in some embodiments a structure of a first DDS signal generator 34 may be the same as that of the second DDS signal generator 14, that is, the structure of the first DDS signal generator 34 is shown in FIG. 5.

Figure 6:
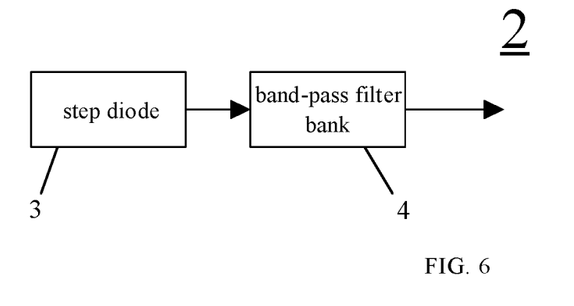
FIG. 6 is a schematic diagram showing a comb spectrum generation module according to an embodiment of the present disclosure.

In some embodiments, as shown in FIG. 6, the comb spectrum generation module may include a step diode 3, which is configured to generate a plurality of harmonic signals with the frequency of the second reference signal as a fundamental frequency according to the second reference signal. The step diode 3 is very special in terms of transient response, fall time of the step diode 3 is about 0, and a rapid change in current (i.e., a steep current waveform) occurs when the step diode 3 is turned off. Therefore, the step diode 3 is a reactive element having high nonlinearity, and can generate rich harmonic components while being applied in a circuit. In the embodiments of the present disclosure, the plurality of harmonic signals having the frequency of the second reference signal as the fundamental frequency can be realized by a relatively simple circuit including the step diode 3.

In some embodiments, still with reference to FIG. 6, the comb spectrum generation module 2 further includes: a band-pass filter bank 4, which is configured to filter the plurality of harmonic signals with the frequency of the second reference signal as the fundamental frequency, so as to generate the fundamental signal group. In the embodiments of the present disclosure, the band-pass filter bank 4 may filter the plurality of harmonic signals which are generated by the step diode 3 and have the frequency of the second reference signal served as the fundamental frequency, so as to remove noise signals from the harmonic signals, and the number of stages and a frequency range of the harmonic signals in the fundamental signal group generated by the comb spectrum generation module 2 may be selected. In this way, the comb spectrum generation module 2 has a simple circuit structure, and is easy to manufacture.

Figure 7:
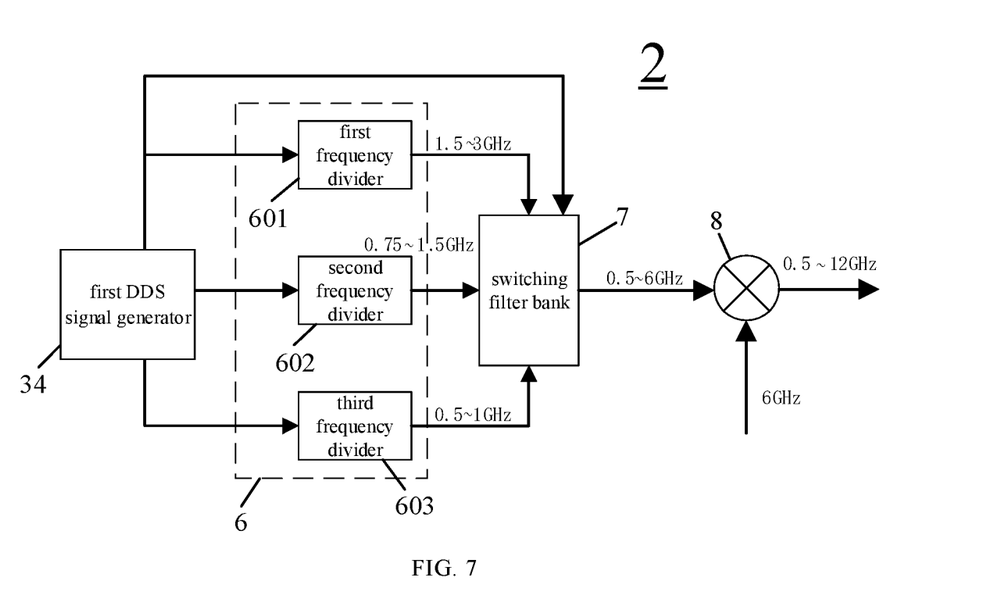
FIG. 7 is a schematic diagram showing a comb spectrum generation module according to another embodiment of the present disclosure.

In some embodiments, as shown in FIG. 7 which is a schematic diagram showing another comb spectrum generation module 2. The comb spectrum generation module 2 includes a first DDS signal generator 34 and a frequency divider set 6. The first DDS signal generator 34 is configured to generate the second reference signal according to the signal to be output by the frequency generator. The frequency divider set 6 is configured to generate a plurality of first frequency-divided signals according to the second reference signal. The first frequency-divided signals include a plurality of harmonic signals having the first frequency and/or the second frequency as a fundamental frequency. In the embodiments of the present disclosure, the first DDS signal generator 34 may generate the second reference signal with a relatively high frequency. For example, a frequency range of the second reference signal may be from 3 GHz to 6 GHz. the frequency divider group 6 performs a frequency division operation on the second reference signal to generate the plurality of first frequency-divided signals. At this time, a fundamental signal group output by the comb spectrum generation module 2 can be realized by reasonably setting the frequency divider group.

In some embodiments, still with reference to FIG. 7, the frequency divider group 6 includes a first frequency divider 601, a second frequency divider 602, and a third frequency divider 603. The first frequency-divided signals include a first frequency-divided sub-signal, a second frequency-divided sub-signal, and a third frequency-divided sub-signal. The first frequency divider 601 is configured to generate the first frequency-divided sub-signal according to the second reference signal, so that a frequency of the first frequency-divided sub-signal is a half of the frequency of the second reference signal. The second frequency divider 602 is configured to generate the second frequency-divided sub-signal according to the second reference signal, so that a frequency of the second frequency-divided sub-signal is one-fourth of the frequency of the second reference signal. The third frequency divider 603 is configured to generate the third frequency-divided sub-signal according to the second reference signal, so that a frequency of the third frequency-divided sub-signal is one sixth of the frequency of the second reference signal. Since the frequency of the second reference signal ranges from 3 GHz to 6 GHz, the frequency of the first frequency-divided sub-signal may range from 1.5 GHz to 3 GHz, the frequency of the second frequency-divided sub-signal may range from 0.75 GHz to 1.5 GHz, and the frequency of the second frequency-divided sub-signal may range from 0.5 GHz to 1 GHz. At this time, the first frequency-divided sub-signal, the second frequency-divided sub-signal, and the third frequency-divided sub-signal are screened to obtain the plurality of harmonic signals with the first frequency and/or the second frequency as the fundamental frequency.

In some embodiments, the comb spectrum generation module 2 shown in FIG. 7 further includes a switching filter bank 7, which is configured to generate a plurality of harmonic signals with the frequency of the second reference signal as a fundamental frequency according to the plurality of first frequency-divided signals and the second reference signal. In the embodiments of the present disclosure, the frequency range of the second reference signal may be from 3 GHz to 6 GHz, the frequency range of the first frequency-divided sub-signal may be from 1.5 GHz to 3 GHZ, the frequency range of the second frequency-divided sub-signal may be from 0.75 GHz to 1.5 GHz, and the frequency range of the third frequency-divided sub-signal may be from 0.5 GHz to 1 GHz. Therefore, after the first frequency-divided signals and the second reference signal are selectively filtered by the switching filter bank 7, the plurality of harmonic signals which have the first frequency and/or the second frequency as the fundamental frequency and have a frequency range of 0.5 GHZ-6 GHz may be obtained. In this way, the comb spectrum generation module can generate a harmonic signal group with a relatively large frequency range.

In some embodiments, still with reference to FIG. 7, the comb spectrum generation module 2 shown in FIG. 7 further includes a first mixer 8 configured to generate a fundamental signal group according to a third reference signal and the plurality of harmonic signals with the first frequency and/or the second frequency as the fundamental frequency. In the embodiments of the present disclosure, a frequency of the third reference signal may be 6 GHz, so that a frequency of a signal output by the first mixer 8 may range from 0.5 GHz to 12 GHz. In this way, the frequency range of the harmonic signal group generated by the comb spectrum generation module 2 can be further expanded.

It should be noted that, in some embodiments, some of the comb spectrum generation modules 2 in the frequency generator may adopt the structure of the comb spectrum generation module 2 shown in FIG. 6, and the others may adopt the structure of the comb spectrum generation module 2 shown in FIG. 7; or all the comb spectrum generation modules 2 in the frequency generator may adopt the structure of the comb spectrum generation module 2 shown in FIG. 6; or all the comb spectrum generation modules 2 in the frequency generator may adopt the structure of the comb spectrum generation module 2 shown in FIG. 7. All the three cases are all within the scope of the embodiments of the present disclosure.

The above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure. and those modifications and improvements are also considered to fall within the scope of the present disclosure.

What is claimed is:

1. A frequency generator, comprising: N stages of mixing modules and N stages of comb spectrum generation modules; wherein, $N \geq 2$;

each of the comb spectrum generation modules is configured to provide a mixing module in a same stage as the comb spectrum generation module with a fundamental signal group generated according to a second reference signal; and different stages of fundamental signal groups are generated based on different second reference signals;

a $1^{st}$-stage mixing module is configured to generate a $1^{st}$-stage mixed signal according to a $1^{st}$-stage fundamental signal group and a first reference signal; and the $1^{st}$-stage fundamental signal group comprises a plurality of harmonic signals with a first frequency as a fundamental frequency; and an $i^{th}$-stage mixing module is configured to generate an $i^{th}$-stage mixed signal according to an $i^{th}$-stage fundamental signal group and a $(i-1)^{th}$-stage mixed signal; the $i^{th}$-stage fundamental signal group comprises a plurality of harmonic signals with an $i^{th}$ frequency as a fundamental frequency; and $2 \leq i \leq N$.

2. The frequency generator of claim 1, wherein each of at least some of the comb spectrum generation modules comprises: a step diode configured to generate, according to the second reference signal, a plurality of harmonic signals with a frequency of the second reference signal as a fundamental frequency.

3. The frequency generator of claim 2, wherein each of the at least some of the comb spectrum generation modules further comprises:

a band-pass filter bank configured to filter the plurality of harmonic signals with the frequency of the second reference signal as the fundamental frequency to generate the fundamental signal group.

4. The frequency generator of claim 1, wherein each of at least some of the comb spectrum generation modules comprises:

a first Direct Digital Synthesis (DDS) signal generator configured to generate the second reference signal according to a signal to be output by the frequency generator; and a frequency divider group configured to generate a plurality of first frequency-divided signals according to the second reference signal; and the plurality of first frequency-divided signals comprise the plurality of harmonic signals with the $i^{th}$ frequency as the fundamental frequency.

5. The frequency generator of claim 4, wherein each of the at least some of the comb spectrum generation modules further comprises a switching filter bank configured to generate the plurality of harmonic signals with the $i^{th}$ frequency as the fundamental frequency according to the plurality of first frequency-divided signals and the second reference signal.

6. The frequency generator of claim 4, wherein each of the at least some of the comb spectrum generation modules further comprises a first mixer configured to generate the fundamental signal group according to a third reference signal and the plurality of harmonic signals with the $i^{th}$ frequency as the fundamental frequency.

7. The frequency generator of claim 4, wherein the frequency divider group comprises a first frequency divider, a second frequency divider, and a third frequency divider; and the first frequency-divided signals comprise a first frequency-divided sub-signal, a second frequency-divided sub-signal, and a third frequency-divided sub-signal;

the first frequency divider is configured to generate the first frequency-divided sub-signal according to the second reference signal such that a frequency of the first frequency-divided sub-signal is a half of a frequency of the second reference signal;

the second frequency divider is configured to generate the second frequency-divided sub-signal according to the second reference signal such that a frequency of the second frequency-divided sub-signal is one fourth of the frequency of the second reference signal; and the third frequency divider is configured to generate the third frequency-divided sub-signal according to the second reference signal such that a frequency of the third frequency-divided sub-signal is one sixth of the frequency of the second reference signal.

8. The frequency generator of claim 1, wherein each of the mixing modules comprise a double balanced mixer having a first signal input terminal, a second signal input terminal, and a first signal output terminal;
the first signal input terminal is configured to receive the harmonic signals in the fundamental signal group;
the second signal input terminal is configured to receive the first reference signal or the $(i-1)^{th}$-stage mixed signal; and
the first signal output terminal is configured to generate the mixed signal according to the signal received by the first signal input terminal and the signal received by the second signal input terminal.

9. The frequency generator of claim 8, wherein the first frequency is equal to or less than twice a frequency of the first reference signal.

10. The frequency generator of claim 8, wherein an $N^{th}$-stage mixing module comprises:
a fourth frequency divider configured to generate a first mixed sub-signal according to the mixed signal output from the first signal output terminal of the double balanced mixer in the $N^{th}$-stage mixing module; and
a first frequency multiplier configured to generate a second mixed sub-signal according to the mixed signal output from the first signal output terminal of the double balanced mixer in the $N^{th}$-stage mixing module; wherein
an $N^{th}$-stage mixed signal generated by the $N^{th}$-stage mixing module comprises the first mixed sub-signal, the second mixed sub-signal, and the mixed signal output from the first signal output terminal of the double balanced mixer in the $N^{th}$-stage mixing module.

11. The frequency generator of claim 1, further comprising: a first signal generation module configured to generate the first reference signal according to a signal to be output by the frequency generator.

12. The frequency generator of claim 11, wherein the first signal generation module comprises a phase locked loop configured to generate the first reference signal according to the signal to be output by the frequency generator.

13. The frequency generator of claim 11, wherein the first signal generation module comprises a second DDS signal generator configured to generate the first reference signal according to the signal to be output by the frequency generator.

14. The frequency generator of claim 1, wherein, N is 2, and i is 2.

* * * * *